United States Patent
Chen

(10) Patent No.: US 8,492,056 B2
(45) Date of Patent: Jul. 23, 2013

(54) COLOR FILTER AND MANUFACTURING METHOD THEREOF

(75) Inventor: Wei-Hsiao Chen, Tainan County (TW)

(73) Assignee: Himax Display, Inc., Tainan (TW)

( * ) Notice: Subject to any disclaimer, the term of this patent is extended or adjusted under 35 U.S.C. 154(b) by 471 days.

(21) Appl. No.: 12/604,161

(22) Filed: Oct. 22, 2009

(65) Prior Publication Data

US 2011/0097654 A1    Apr. 28, 2011

(51) Int. Cl.
*G02B 5/20* (2006.01)

(52) U.S. Cl.
USPC .............................................. 430/7

(58) Field of Classification Search
None
See application file for complete search history.

(56) References Cited

U.S. PATENT DOCUMENTS

| 2002/0009654 A1* | 1/2002 | Yamagata et al. ............... 430/7 |
| 2007/0145504 A1* | 6/2007 | Kim ............................... 257/432 |
| 2009/0230490 A1* | 9/2009 | Yokozawa ...................... 257/432 |

FOREIGN PATENT DOCUMENTS

| JP | 56-094310 A | * | 7/1981 |
| JP | 9-197329 A | * | 7/1997 |

OTHER PUBLICATIONS

Computer-generated translation of JP 9-197392 (Jul. 1997).*

* cited by examiner

*Primary Examiner* — John A. McPherson
(74) *Attorney, Agent, or Firm* — J.C. Patents

(57) ABSTRACT

A color filter including a substrate, a plurality of first single-layer filter units and a plurality of first multilayer filter units is provided. The substrate has a plurality of first regions and a plurality of second regions. The first single-layer filter units is disposed on the substrate and located in the first regions respectively. The first multilayer filter units is disposed on the substrate and located in the second regions respectively. A manufacturing method for a color filter is also provided.

9 Claims, 6 Drawing Sheets

COLOR FILTER AND MANUFACTURING METHOD THEREOF

BACKGROUND OF THE INVENTION

1. Field of the Invention

The present invention relates to an optical film and a manufacturing method thereof. More particularly, the present invention relates to a color filter and a manufacturing method thereof.

2. Description of Related Art

Color filters are generally categorized into filters having single film layers and filters having composite film layer structures. Taking the filters having the single film layers as an example, in most of the filters having the single film layers, three photolithography processes are performed to color photoresist of three primary colors, so as to sequentially form three color photoresist films on a substrate to form the color filter. Since the color photoresist film is formed by dropping color photoresist liquid on the substrate and evenly coating it on the substrate through a spin coating process, most of the color photoresists are wasted during the spin coating process, and a pure light color filter film is not easy to be manufactured.

Moreover, the filter having the composite film layer structures is formed by stacking film layers with different refractive indexes in interlace, so as to filter specific wavelengths. During a manufacturing process of a generally filter having the composite film layer structures, the film layers having different refractive indexes are sequentially formed on the substrate first, and then a sputter etch process is performed to pattern the film layers. Though the color filter layer fabricated according to such method may have a better filtering effect, the filter layers of different colors are difficult to be fabricated on a same substrate, and an etching rate thereof is very low, so that mass production of the color filters cannot be effectively achieved.

SUMMARY OF THE INVENTION

The present invention is directed to a color filter having a better filtering effect.

The present invention is directed to a manufacturing method of a color filter, by which the aforementioned color filter can be manufactured, and manufacturing steps can be simplified and a production capacity can be increased.

The present invention provides a color filter including a substrate, a plurality of first single-layer filter units and a plurality of first multilayer filter units. The substrate has a plurality of first regions and a plurality of second regions. The first single-layer filter units are respectively disposed on the substrate and located in the first regions. The first multilayer filter units are respectively disposed on the substrate and located in the second regions.

In an embodiment of the present invention, a material of the first single-layer filter unit includes a photosensitive material.

In an embodiment of the present invention, each of the multilayer filter units includes at least one low refraction layer and at least one high refraction layer.

In an embodiment of the present invention, materials of the low refraction layer and the high refraction layer are two materials selected from silicon dioxide, titanium oxide, and nitrogen pentoxide.

In an embodiment of the present invention, the color filter further includes a plurality of second filter units, and the substrate further includes a plurality of third regions, the second filter units are respectively disposed on the substrate and located in the third regions.

In an embodiment of the present invention, the second filter units include a plurality of second single-layer filter units or a plurality of second multilayer filter units.

In an embodiment of the present invention, the first single-layer filter units, the first multilayer filter units and the second filter units are interconnected.

In an embodiment of the present invention, the first single-layer filter units, the second filter units and the first multilayer filter units are respectively red filter units, blue filter units and green filter units.

The present invention provides a manufacturing method for a color filter. First, a substrate is provided. The substrate has a plurality of first regions and a plurality of second regions. Next, a first multilayer filter material layer is formed on the substrate, wherein the first multilayer filter material layer covers the first regions and the second regions. Next, the first multilayer filter material layer is patterned to respectively form a plurality of first multilayer filter units at the second regions. Next, a first single-layer filter material layer is formed on the substrate, wherein the first single-layer filter material layer covers the first multilayer filter units and the first regions. Finally, the first single-layer filter material layer is patterned to respectively form a plurality of first single-layer filter units at the first regions.

In an embodiment of the present invention, a method of forming the first multilayer filter material layer on the substrate includes multiple thin film deposition processes.

In an embodiment of the present invention, the first multilayer filter material layer includes at least one low refraction material layer and at least one high refraction material layer.

In an embodiment of the present invention, materials of the low refraction material layer and the high refraction material layer are two materials selected from silicon dioxide, titanium oxide, and nitrogen pentoxide.

In an embodiment of the present invention, the step of patterning the first multilayer filter material layer includes forming a photoresist layer on the first multilayer filter material layer; exposing and developing the photoresist layer to form a patterned photoresist layer; etching the first multilayer filter material layer outside the patterned photoresist layer by using the patterned photoresist layer as an etching mask, so as to form the first multilayer filter units; and removing the patterned photoresist layer.

In an embodiment of the present invention, a method of forming the first single-layer filter material layer includes a spin coating method.

In an embodiment of the present invention, a material of the first single-layer filter unit includes a photosensitive material.

In an embodiment of the present invention, the substrate further includes a plurality of third regions, and after the first single-layer filter units are formed, the method further includes forming a second filter material layer on the substrate, wherein the second filter material layer covers the first multilayer filter units, the first single-layer filter units and the third regions; and patterning the second filter material layer to respectively form a plurality of second filter units in the third regions.

In an embodiment of the present invention, a material of the second filter material layer includes a photosensitive material or an inorganic material.

In an embodiment of the present invention, the second filter units include a plurality of second single-layer filter units or a plurality of second multilayer filter units.

In an embodiment of the present invention, the first single-layer filter units, the first multilayer filter units and the second filter units are interconnected.

In an embodiment of the present invention, the first single-layer filter units, the second filter units and the first multilayer filter units are respectively red filter units, blue filter units and green filter units.

According to the above descriptions, the color filter of the present invention simultaneously has the single-layer filter units and the multilayer filter units. Therefore, compared to the conventional filter having a single film layer, the color filter of the present invention has a better filtering effect. Moreover, compared to the conventional filter having composite film layer structures, manufacturing steps of the color filter of the present invention can be simplified, and a production capacity can be increased.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
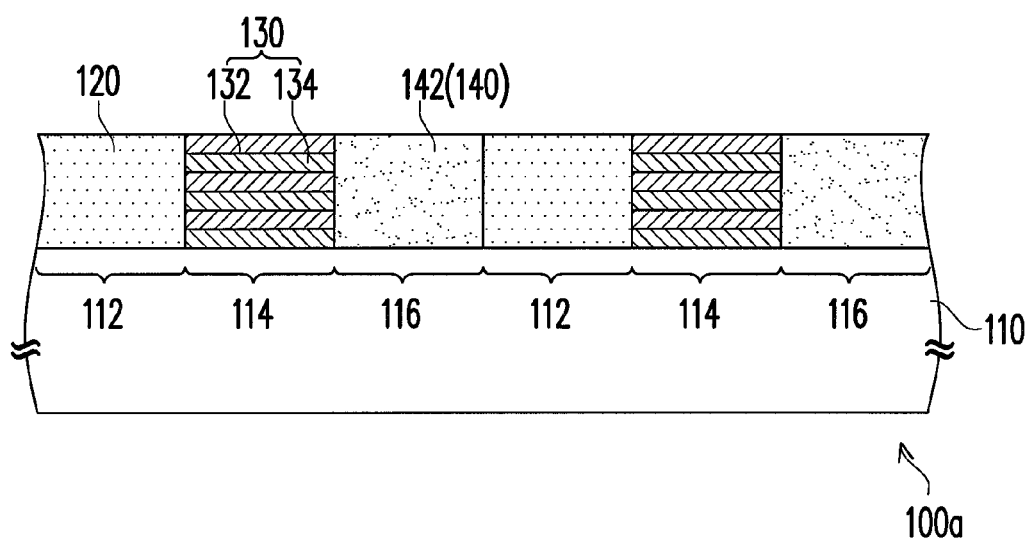
FIG. 1 is a cross-sectional view of a color filter according to an embodiment of the present invention.

FIG. 1 is a cross-sectional view of a color filter according to an embodiment of the present invention. Referring to FIG. 1, in the present embodiment, the color filter 100a includes a substrate 110, a plurality of first single-layer filter units 120, a plurality of first multilayer filter units 130 and a plurality of second filter units 140.

The substrate 110 has a plurality of first regions 112, a plurality of second regions 114 and a plurality of third regions 116. To be specific, the first single-layer filter units 120 are respectively disposed on the substrate 110 and located in the first regions 112. The first multilayer filter units 130 are respectively disposed on the substrate 110 and located in the second regions 114. The second filter units 140 are respectively disposed on the substrate 110 and located in the third regions 116. The first single-layer filter units 120, the first multilayer filter units 130 and the second filter units 140 are interconnected and are sequentially and periodically arranged. Certainly, in other embodiments that are not illustrated, the first single-layer filter units 120, the first multilayer filter units 130 and the second filter units 140 can also be arranged non-periodically.

Particularly, in the present embodiment, a material of the first single-layer filter units 120 includes a photosensitive material, for example, a color photoresist. Each of the first multilayer filter units 130 includes at least one low refraction layer 132 and at least one high refraction layer 134, wherein materials of the low refraction layer 132 and the high refraction layer 134 are, for example, two inorganic materials selected from silicon dioxide, titanium oxide, and nitrogen pentoxide. Namely, the first multilayer filter unit 130 is formed by stacking the low refraction layer 132 and the high refraction layer 134 in interlace. The second filter units 140 can be a plurality of second single-layer filter units 142, and a material thereof includes a photosensitive material, for example, the color photoresist. Moreover, the first single-layer filter unit 120 of the present embodiment is, for example, a red filter unit, the second single-layer filter unit 142 is, for example, a blue filter unit, and the first multilayer filter unit 130 is, for example, a green filter unit, though the present invention is not limited thereto. Human eyes may have different perception degrees for red light, green light and blue light, and the perception degree of the human eyes for the green light is generally higher than that for the red light and the blue light. Therefore, in case that the first multilayer filter unit 130 is the green filter unit, the color filter 100a of the present embodiment may have a better filtering effect.

In brief, since the color filter 100a of the present embodiment simultaneously has the first single-layer filter units 120 and the first multilayer filter units 130, compared to the conventional filter having a single film layer, the color filter 100a of the present embodiment may have the better filtering effect.

In the aforementioned descriptions, only the color filter 100a is introduced, and a manufacturing method thereof is not mentioned. Therefore, an embodiment is provide below for describing the manufacturing method of the color filter 100a, and manufacturing steps of the color filter 100a are described in detail with reference of FIGS. 2A-2I.

Figure 2A:
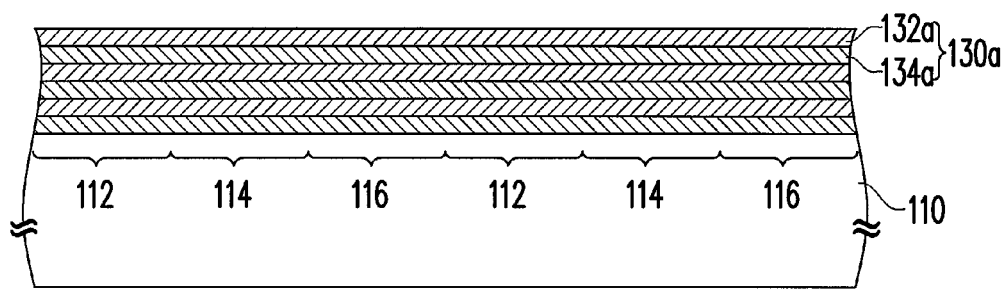
FIGS. 2A to 2I are cross-sectional views illustrating a manufacturing method of a color filter according to an embodiment of the present invention.
Figure 2B:
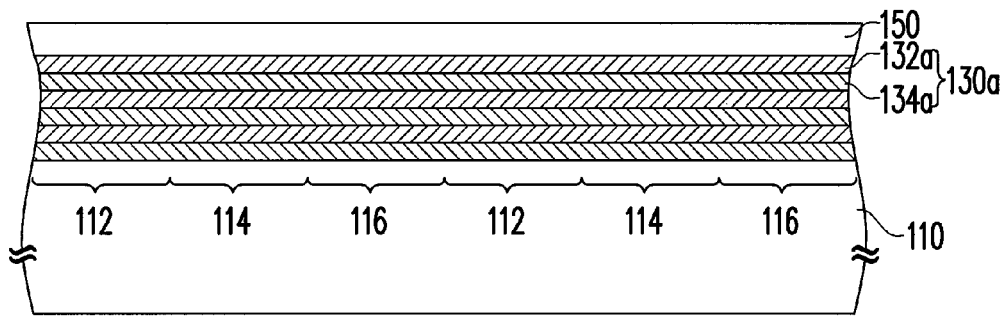
Figure 2C:
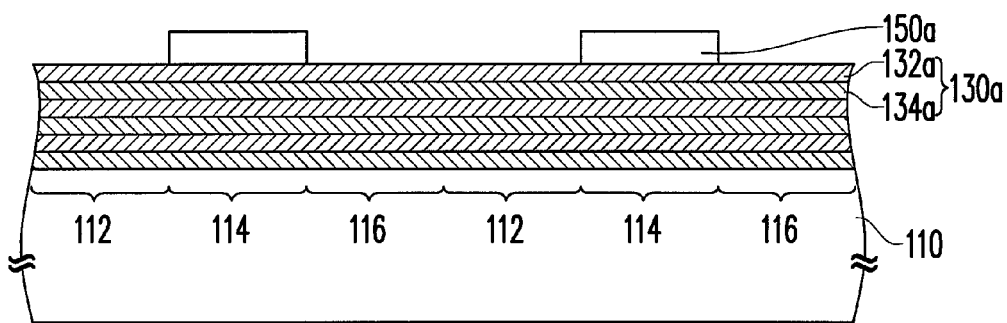
Figure 2D:
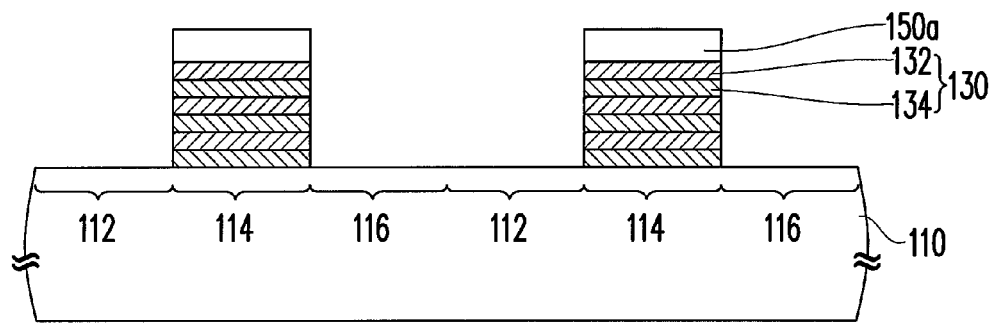
Figure 2E:
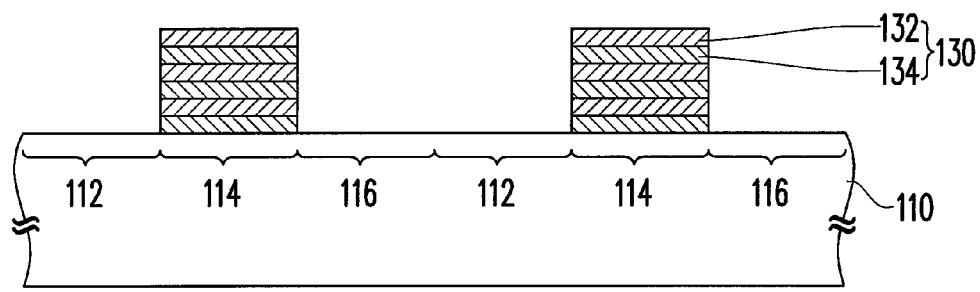

FIGS. 2A to 2I are cross-sectional views illustrating a manufacturing method of a color filter according to an embodiment of the present invention. Referring to FIG. 2A, according to the manufacturing method of the color filter 100a of the present embodiment, first, the substrate 110 is provided. In detail, the substrate has a plurality of the first regions 112, a plurality of the second regions 114 and a plurality of the third regions 116.

Next, referring to FIG. 2A again, a first multilayer filter material layer 130a is formed on the substrate 110, wherein the first multilayer filter material layer 130a covers the first regions 112, the second regions 114 and the third regions 116. Particularly, in the present embodiment, the method of forming the first multilayer filter material layer 130a on the substrate 110 includes multiple thin film deposition processes. In detail, the first multilayer filter material layer 130a includes at least one low refraction material layer 132a and at least one high refraction material layer 134a, wherein materials of the low refraction material layer 132a and the high refraction material layer 134a are two materials selected from silicon dioxide, titanium oxide, and nitrogen pentoxide.

Next, the first multilayer filter material layer 130a is patterned to respectively form a plurality of the first multilayer filter units 130 at the second regions 114. In the present embodiment, patterning of the first multilayer filter material layer 130a includes following steps. First, referring to FIG. 2B, a photoresist layer 150 is formed on the first multilayer filter material layer 130a, wherein the photoresist layer 150 covers the first multilayer filter material layer 130a. Next, referring to FIG. 2C, the photoresist layer 150 is exposed and developed to form a patterned photoresist layer 150a, wherein the patterned photoresist layer 150a corresponds to the second regions 114 of the substrate 110. Next, referring to FIG. 2D, the first multilayer filter material layer 130a outside the patterned photoresist layer 150a is etched by using the patterned photoresist layer 150a as an etching mask, so as to form the first multilayer filter units 130. In other words, the first multilayer filter units 130 are formed on the second regions 114 of the substrate 110. Finally, referring to FIG. 2E, the patterned photoresist layer 150a is removed to complete manufacturing the first multilayer filter units 130 on the substrate 110. Moreover, the first multilayer filter unit 130 is, for example, the green filter unit.

Figure 2F:
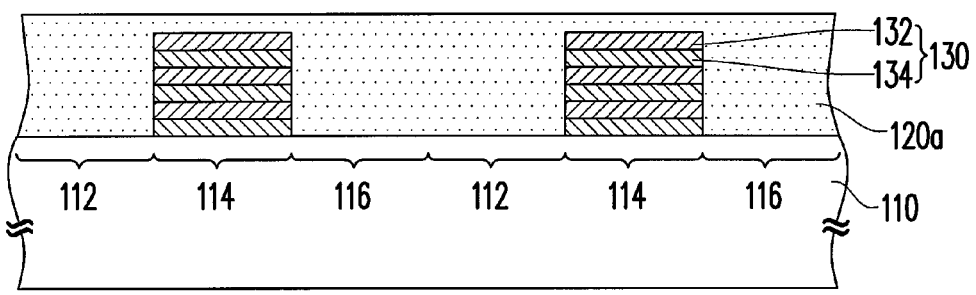

Next, referring to FIG. 2F, a first single-layer filter material layer 120a is formed on the substrate 110, wherein the first single-layer filter material layer 120a covers the first multilayer filter units 130, the first regions 112 and the third regions 116. In the present embodiment, the method of forming the first single-layer filter material layer 120a includes a spin coating method. Moreover, a material of the first single-layer filter material layer 120a includes a photosensitive material, which is, for example, the color photoresist.

Figure 2G:
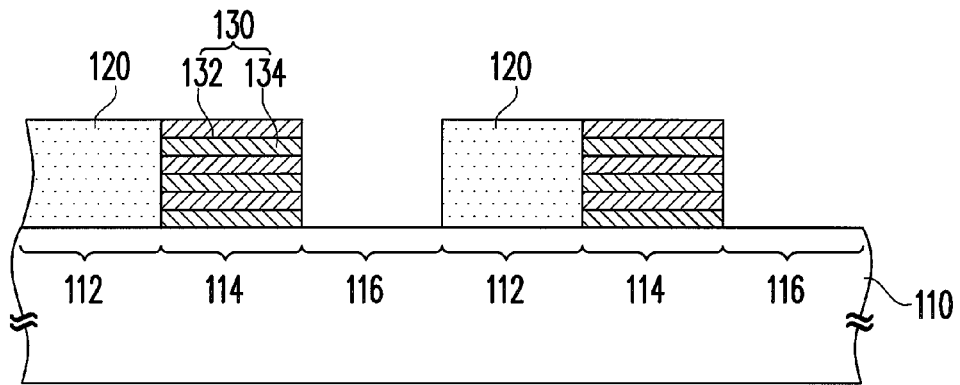

Next, referring to FIG. 2G, the first single-layer filter material layer 120a is patterned to respectively form a plurality of the first single-layer filter units 120 at the first regions 112. In the present embodiment, the method of patterning the first single-layer filter material layer 120a includes performing an exposing process and a developing process. The first single-layer filter unit 120 is, for example, the red filter unit.

Figure 2H:
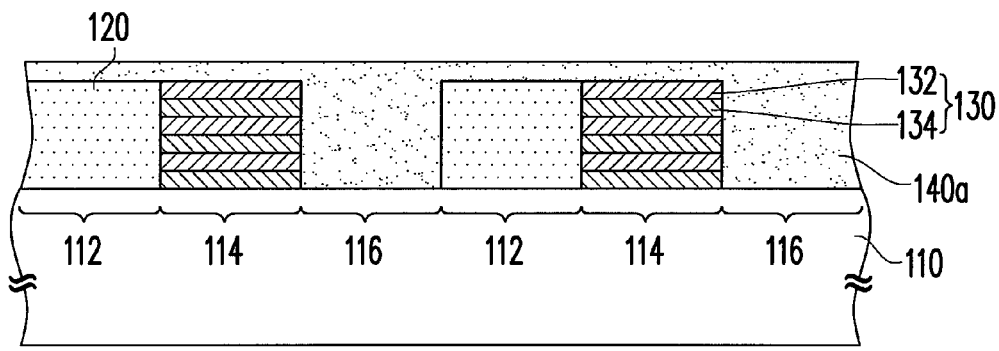

Next, referring to FIG. 2H, a second single-layer filter material layer 140a is formed on the substrate 110, wherein the second single-layer filter material layer 140a covers the first multilayer filter units 130, the first single-layer filter units 120 and the third regions 116. In the present embodiment, the method of forming the second single-layer filter material layer 140a includes the spin coating method. Moreover, a material of the second single-layer filter material layer 140a includes a photosensitive material, which is, for example, the color photoresist.

Figure 2I:
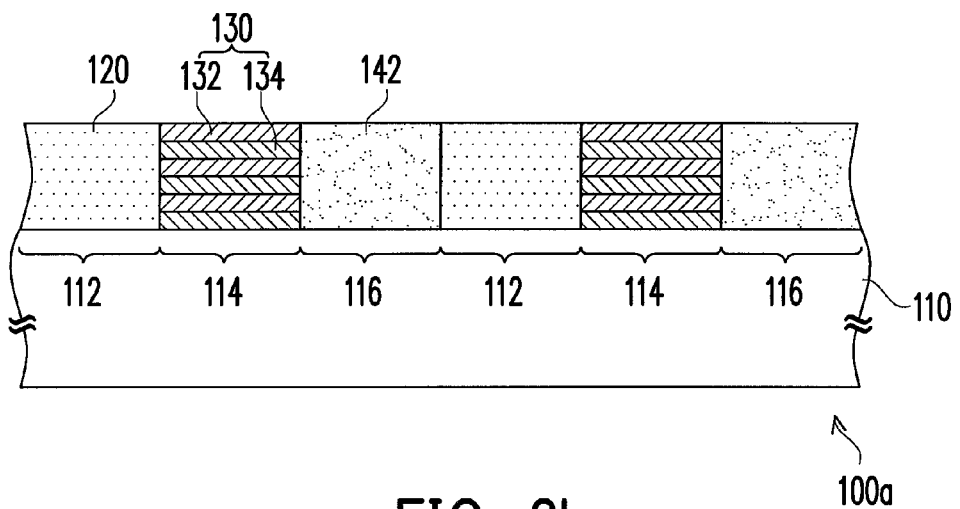

Finally, referring to FIG. 2I, the second single-layer filter material layer 140a is patterned to respectively form a plurality of the second single-layer filter units 142 at the third regions 116. Now, the first single-layer filter units 120, the first multilayer filter units 130, and the second single-layer filter units 142 are interconnected on the substrate 110 and are sequentially and periodically arranged. Moreover, in the present embodiment, the method of patterning the second single-layer filter material layer 140a includes performing an exposing process and a developing process. The second single-layer filter unit 142 is, for example, the blue filter unit. Now, manufacturing of the color filter 100a is completed.

Figure 3:
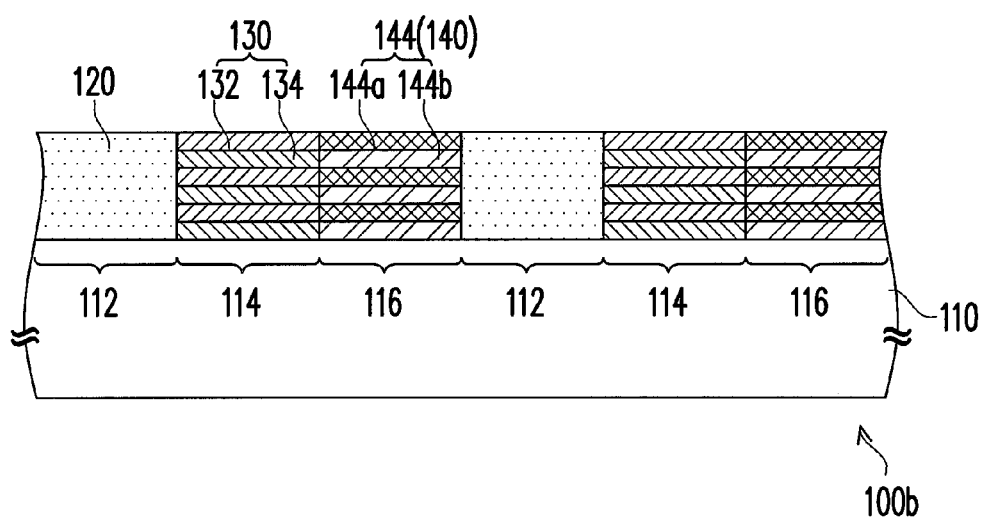
FIG. 3 is a cross-sectional view of a color filter according to another embodiment of the present invention.

It should be noticed that a form of the second filter unit 140 is not limited by the present invention. Though, the second filter units 140 are embodied by the second single-layer filter units 142, in another embodiment, referring to FIG. 3, the second filter units 140 can also be a plurality of second multilayer filter units 144. In detail, in a color filter 100b of FIG. 3, each of the second multilayer filter units 144 is, for example, formed by staking a low refraction layer 144a and a high refraction layer 144b in interlace, wherein materials of the low refraction layer 144a and the high refraction layer 144b are, for example, two inorganic materials selected from silicon dioxide, titanium oxide, and nitrogen pentoxide. In other words, a pattern of the color filter 100a of FIG. 1 is only used as an example, which is not used for limiting the present invention.

Moreover, manufacturing methods of the color filter 100b of the present embodiment and the color filter 100a of the aforementioned embodiment are approximately the same. In detail, after the first single-layer filter material layer 120a is patterned according to FIG. 2G, a second multilayer filter material layer (not shown) is formed on the substrate 110. A method of forming the second multilayer filter material layer includes multiple thin film deposition processes, and a material of the second multilayer filter material layer is an inorganic material, for example, silicon dioxide, titanium oxide, or nitrogen pentoxide. Next, the second multilayer filter material layer is patterned to respectively form a plurality of the second multilayer filter units 144 at the third regions 116. Steps of patterning the second multilayer filter material layer are approximately the same as the steps of patterning the first multilayer filter material layer 130a, please refer to FIG. 2B to FIG. 2E, so that detailed descriptions thereof are not repeated. Now, manufacturing of the color filter 100b is approximately completed.

Figure 4:
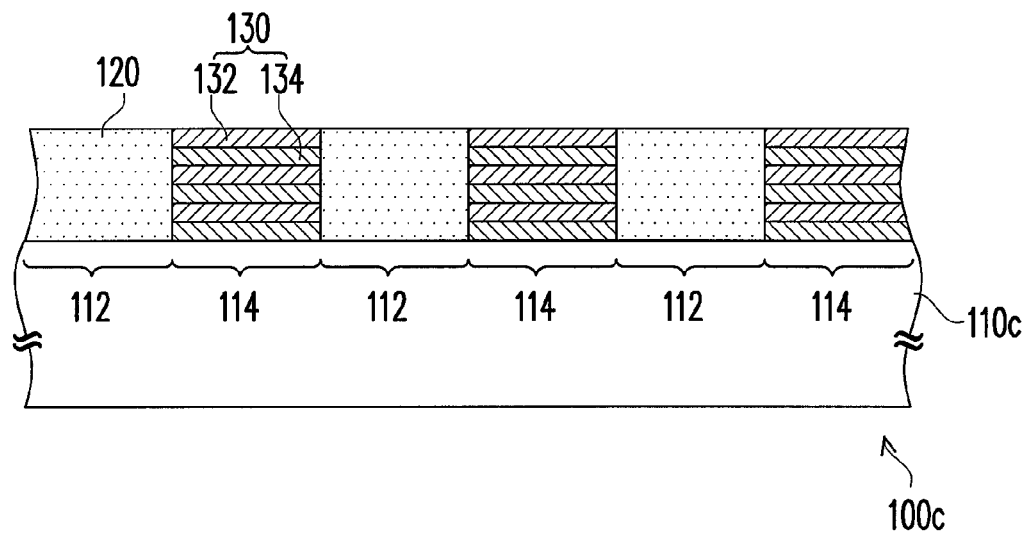
FIG. 4 is a cross-sectional view of a color filter according to another embodiment of the present invention.

Certainly, in another embodiment, referring to FIG. 4, the color filter 100c of the substrate 110c can also only have a plurality of first regions 112 and a plurality of second regions 114. To be specific, the first single-layer filter units 120 are respectively disposed on the substrate 110c and located in the first regions 112. The first multilayer filter units 130 are respectively disposed on the substrate 110c and located in the second regions 114, wherein the first multilayer filter unit 130 is formed by stacking the low refraction layer 132 and the high refraction layer 134 in interlace. The first single-layer filter unit 120 of the present embodiment is, for example, a red filter unit, and the first multilayer filter unit 130 is, for example, a green filter unit, though the present invention is not limited thereto.

Figure 5:
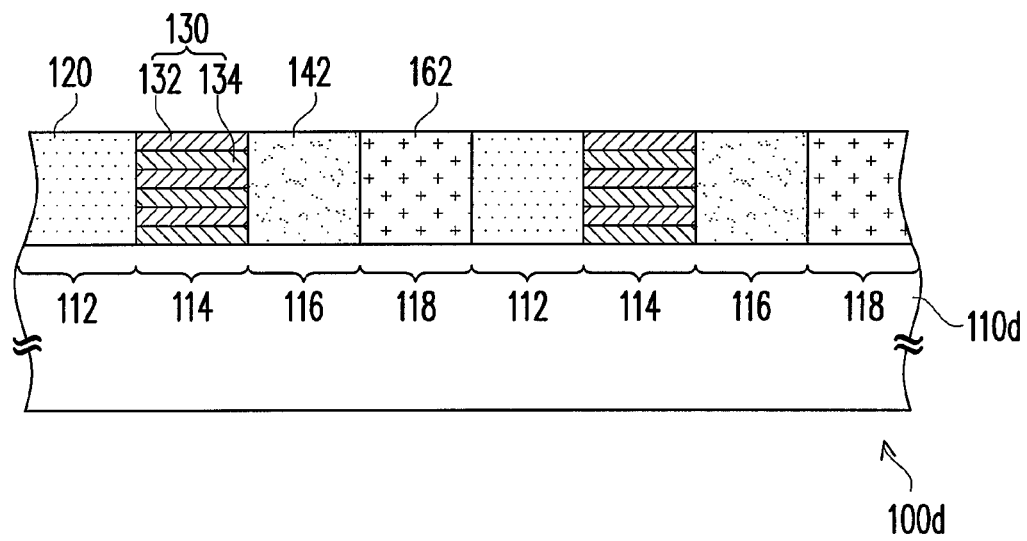
FIG. 5 is a cross-sectional view of a color filter according to another embodiment of the present invention.

Moreover, in still another embodiment, referring to FIG. 5, the color filter 100d of the substrate 110d can also have a plurality of first regions 112, a plurality of second regions 114, a plurality of third regions 116 and a plurality of forth regions 118. In detail, in the color filter 100d of FIG. 5, the first single-layer filter units 120 are respectively disposed on the substrate 110d and located in the first regions 112. The first multilayer filter units 130 are respectively disposed on the substrate 110d and located in the second regions 114, wherein the first multilayer filter unit 130 is formed by stacking the low refraction layer 132 and the high refraction layer 134 in interlace. The second single-layer filter units 142 are respectively disposed on the substrate 110d and located in the third regions 116. The third single-layer filter units 162 are respectively disposed on the substrate 110d and located in the forth regions 118. In addition, The first single-layer filter unit 120 of the present embodiment is, for example, a red filter unit, the first multilayer filter unit 130 is, for example, a green filter unit, the second single-layer filter unit 142 is, for example, a blue filter unit, and a third single-layer filter unit 162 is, for example, a white filter unit, though the present invention is not limited thereto. In other words, in other unshown embodiments, a pattern of the color filter can be other than the mentioned above according to the practical requirement, which the present invention is not limited to.

In brief, during the manufacturing processes of the color filters 100a and 100b, the multiple thin film deposition processes are first performed to form the first multilayer filter material layer 130a. Next, the spin coating method is used to form the first single-layer filter material layer 120a on the substrate 110. Therefore, when the first multilayer filter material layer 130a is formed on the substrate 110, a problem of poor step coverage can be avoided. Moreover, since the material of the first single-layer filter material layer 120a is a photosensitive material, fabrication of the first single-layer filter units 120 can be completed by only performing the exposing process and the developing process. In other words, the first single-layer filter units 120 are fabricated without considering an etching process, which may effectively reduce a fabrication complexity and improve the fabrication efficiency. In addition, compared to the conventional filter having the composite film layer structures, the manufacturing steps of the color filters 100a and 100b of the present invention can be simplified, and a production capacity can be increased.

In summary, the color filter of the present invention simultaneously has the single-layer filter units and the multilayer filter units. Therefore, compared to the conventional filter having a single film layer, the color filter of the present invention has a better filtering effect. Moreover, compared to the conventional filter having composite film layer structures, manufacturing steps of the color filter of the present invention can be simplified, and a production capacity can be increased. In addition, the second filter units can be fabricated into patterns of single-layer filter units or multilayer filter units according to a usage demand, which may further improve an optical quality of the color filter.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method for a color filter, comprising:
providing a substrate, the substrate having a plurality of first regions and a plurality of second regions;
forming a first multilayer filter material layer on the substrate, wherein the first multilayer filter material layer covers the first regions and the second regions, and a method of forming the first multilayer filter material layer comprises multiple thin film deposition processes;
patterning the first multilayer filter material layer to respectively form a plurality of first multilayer filter units at the second regions;
forming a first single-layer filter material layer on the substrate, wherein the first single-layer filter material layer covers the first multilayer filter units and the first regions, and a method of forming the first single-layer filter material layer comprises a spin coating method; and
patterning the first single-layer filter material layer to respectively form a plurality of first single-layer filter units at the first regions, wherein a material of the first single-layer filter units comprises a photosensitive material, the first single-layer filter units and the first multilayer filter units are interconnected, and the first single-layer filter units do not overlap the first multilayer filter units.

2. The manufacturing method for the color filter as claimed in claim 1, wherein the first multilayer filter material layer comprises at least one low refraction material layer and at least one high refraction material layer.

3. The manufacturing method for the color filter as claimed in claim 2, wherein materials of the at least one low refraction material layer and the at least one high refraction material layer are two materials selected from silicon dioxide, titanium oxide, and nitrogen pentoxide.

4. The manufacturing method for the color filter as claimed in claim 1, wherein the step of patterning the first multilayer filter material layer comprises:
forming a photoresist layer on the first multilayer filter material layer;
exposing and developing the photoresist layer to form a patterned photoresist layer;
etching the first multilayer filter material layer outside the patterned photoresist layer by using the patterned photoresist layer as an etching mask, so as to form the first multilayer filter units; and
removing the patterned photoresist layer.

5. The manufacturing method for the color filter as claimed in claim 1, wherein the substrate further comprises a plurality of third regions, and after the first single-layer filter units are formed, the method further comprises:
forming a second filter material layer on the substrate, wherein the second filter material layer covers the first multilayer filter units, the first single-layer filter units and the third regions; and
patterning the second filter material layer to respectively form a plurality of second filter units in the third regions.

6. The manufacturing method for the color filter as claimed in claim 5, wherein a material of the second filter material layer comprises a photosensitive material or an inorganic material.

7. The manufacturing method for the color filter as claimed in claim 5, wherein the second filter units comprise a plurality of second single-layer filter units or a plurality of second multilayer filter units.

8. The manufacturing method for the color filter as claimed in claim 5, wherein the first single-layer filter units, the first multilayer filter units and the second filter units are interconnected.

9. The manufacturing method for the color filter as claimed in claim 5, wherein the first single-layer filter units, the second filter units and the first multilayer filter units are respectively red filter units, blue filter units and green filter units.

* * * * *